United States Patent
Muramatsu et al.

(10) Patent No.: US 10,121,659 B2
(45) Date of Patent: Nov. 6, 2018

(54) PATTERN FORMING METHOD AND HEATING APPARATUS

(71) Applicant: Tokyo Electron Limited, Tokyo (JP)

(72) Inventors: Makoto Muramatsu, Koshi (JP);
Takahiro Kitano, Koshi (JP);
Tadatoshi Tomita, Koshi (JP); Keiji Tanouchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/716,588

(22) Filed: Sep. 27, 2017

(65) Prior Publication Data
US 2018/0019118 A1    Jan. 18, 2018

Related U.S. Application Data

(62) Division of application No. 14/388,887, filed as application No. PCT/JP2013/081617 on Nov. 25, 2013, now Pat. No. 9,859,118.

(51) Int. Cl.
*H01L 21/027* (2006.01)
*H01L 21/02* (2006.01)
(Continued)

(52) U.S. Cl.
CPC .... *H01L 21/0271* (2013.01); *H01L 21/02118* (2013.01); *H01L 21/02337* (2013.01);
(Continued)

(58) Field of Classification Search
CPC .............. H01L 21/02118; H01L 28/26; H01L 31/02366; H01L 31/03928; H01L 51/0034;
(Continued)

(56) References Cited

U.S. PATENT DOCUMENTS

| 6,260,407 | B1 | 7/2001 | Petro et al. | |
| 2007/0022626 | A1* | 2/2007 | Gomi | F26B 5/04 |
| | | | | 34/329 |
| 2008/0161429 | A1* | 7/2008 | Felix | C08J 3/122 |
| | | | | 521/28 |

(Continued)

FOREIGN PATENT DOCUMENTS

| JP | 2003-155365 A | 5/2003 |
| JP | 2005-029779 A | 2/2005 |

(Continued)

OTHER PUBLICATIONS

K.W. Guarini et al., "Optimization of Diblock Copolymer Thin Film Self Assembly", Advanced Materials, 2002, 14, No. 18, Sep. 16, pp. 1290-1294.

(Continued)

*Primary Examiner* — Moin Rahman
(74) *Attorney, Agent, or Firm* — Posz Law Group, PLC

(57) ABSTRACT

The present invention, when forming a pattern on a substrate, forms a film of a block copolymer containing at least two polymers on the substrate, heats the film of the block copolymer under a solvent vapor atmosphere to subject the block copolymer to phase separation, and removes one of the polymers in the film of the phase-separated block copolymer, thereby accelerating fluidization of the polymers of the block copolymer to enable acceleration of the phase separation.

9 Claims, 3 Drawing Sheets

(51) Int. Cl.
*H01L 21/687* (2006.01)
*H01L 21/67* (2006.01)
*H01L 21/311* (2006.01)

(52) U.S. Cl.
CPC .. *H01L 21/31138* (2013.01); *H01L 21/67109* (2013.01); *H01L 21/67115* (2013.01); *H01L 21/68742* (2013.01)

(58) Field of Classification Search
CPC ............. H01L 51/0035; H01L 51/0036; H01L 51/0043; H01L 2224/0519; H01L 2224/0529; H01L 2224/0539; H01L 2224/0549; H01L 2224/0569; H01L 2224/0579; H01L 2224/0589; H01L 2224/0599; H01L 2224/1319; H01L 2224/1329; H01L 2224/1339
USPC .......... 438/759, 781, 689, 700, 151, 789, 46
See application file for complete search history.

(56) References Cited

U.S. PATENT DOCUMENTS

2012/0034369 A1* 2/2012 Ito ........................... C23C 16/52
427/8
2012/0207940 A1* 8/2012 Muramatsu .......... C09D 153/00
427/510
2012/0223053 A1 9/2012 Millward et al.

FOREIGN PATENT DOCUMENTS

JP 2007-015221 A 1/2007
JP 2007-125699 A 5/2007

OTHER PUBLICATIONS

International Search Report of the International Searching Authority dated Feb. 25, 2014 in the corresponding PCT international application PCT/JP2013/081617 (and English translation).

\* cited by examiner (a)

(b)

(c)

PATTERN FORMING METHOD AND HEATING APPARATUS

This application is a divisional of U.S. patent application Ser. No. 14/388,887 filed on Sep. 29, 2014 which is a U.S. national stage application of PCT/JP2013/081617, filed on Nov. 25, 2013, the disclosures of which are incorporated herein by reference.

TECHNICAL FIELD

The present invention relates to a directed self-assembly (DSA) lithography technique, and relates to a pattern forming method and a heating apparatus each utilizing the technique.

BACKGROUND ART

The practical use of the directed self-assembly lithography technique utilizing a property that a block copolymer is self-assembled is discussed (for example, Patent Documents 1 and 2 and Non-Patent Document 1). In the directed self-assembly lithography technique, first, for example, a solution of a block copolymer containing an A polymer chain and a B polymer chain is applied to a substrate, whereby a thin film of the block copolymer is formed.

Then, when the substrate is heated, the A polymer chain and the B polymer chain mutually randomly solid-dissolve in the thin film undergo phase separation to form A polymer regions and B polymer regions which are regularly arrayed.

The phase separation of the block copolymer is realized by A polymers and B polymers fluidized by heating and the A polymers gathering together and the B polymers gathering together.

PRIOR ART DOCUMENT

Patent Document

[Patent Document 1] Japanese Patent Application Laid-open No. 2005-29779
[Patent Document 2] Japanese Patent Application Laid-open No. 2007-125699
[Non-Patent Document 1] K. W. Guarini, et al., "Optimization of Diblock Copolymer Thin Film Self Assembly", Advanced Materials, 2002, 14, No. 18, September 16, pp. 1290-1294. (p. 1290, ll.31-51)

DISCLOSURE OF THE INVENTION

Problems to Be Solved by the Invention

At the time when heating a substrate on which a thin film of a block copolymer has been formed to subject the block copolymer to phase separation so as to form A polymer regions and B polymer regions, generally the phase separation occurs more surely at a higher temperature and for a longer heating time. However, if the heating temperature is too high, there is a problem of the A polymer and the B polymer becoming difficult to fluidize because a dissolving agent for them evaporate, or the A polymer and/or the B polymer evaporating. Further, an increase in the heating time also causes a problem of a decrease in manufacturing throughput.

In consideration of the above circumstances, the present invention provides a pattern forming method and a heating apparatus each capable of accelerating fluidization of polymers of a block copolymer to enable acceleration of phase separation.

Means for Solving the Problems

According to a first aspect of the present invention, the present invention is a pattern forming method of forming a pattern on a substrate, including the steps of: forming a film of a block copolymer containing at least two polymers on the substrate; heating the film of the block copolymer under a solvent vapor atmosphere to subject the block copolymer to phase separation; and removing one of the polymers in the film of the phase-separated block copolymer.

According to a second aspect of the present invention, the present invention is a heating apparatus for heating a substrate, including: a mounting table which is disposed in a container and on which the substrate, on which a film of a block copolymer is to be formed, is mounted; a heating unit which is embedded in the mounting table and heats the substrate mounted on the mounting table; a solvent vapor supply unit which supplies gas containing vapor of a solvent into the container; and an ejection unit which ejects the gas in the container.

Effect of the Invention

According to the present invention provides, a pattern forming method and a heating apparatus each capable of accelerating fluidization of polymers of a block copolymer to enable acceleration of phase separation.

BEST MODE FOR CARRYING OUT THE INVENTION

Figure 1:
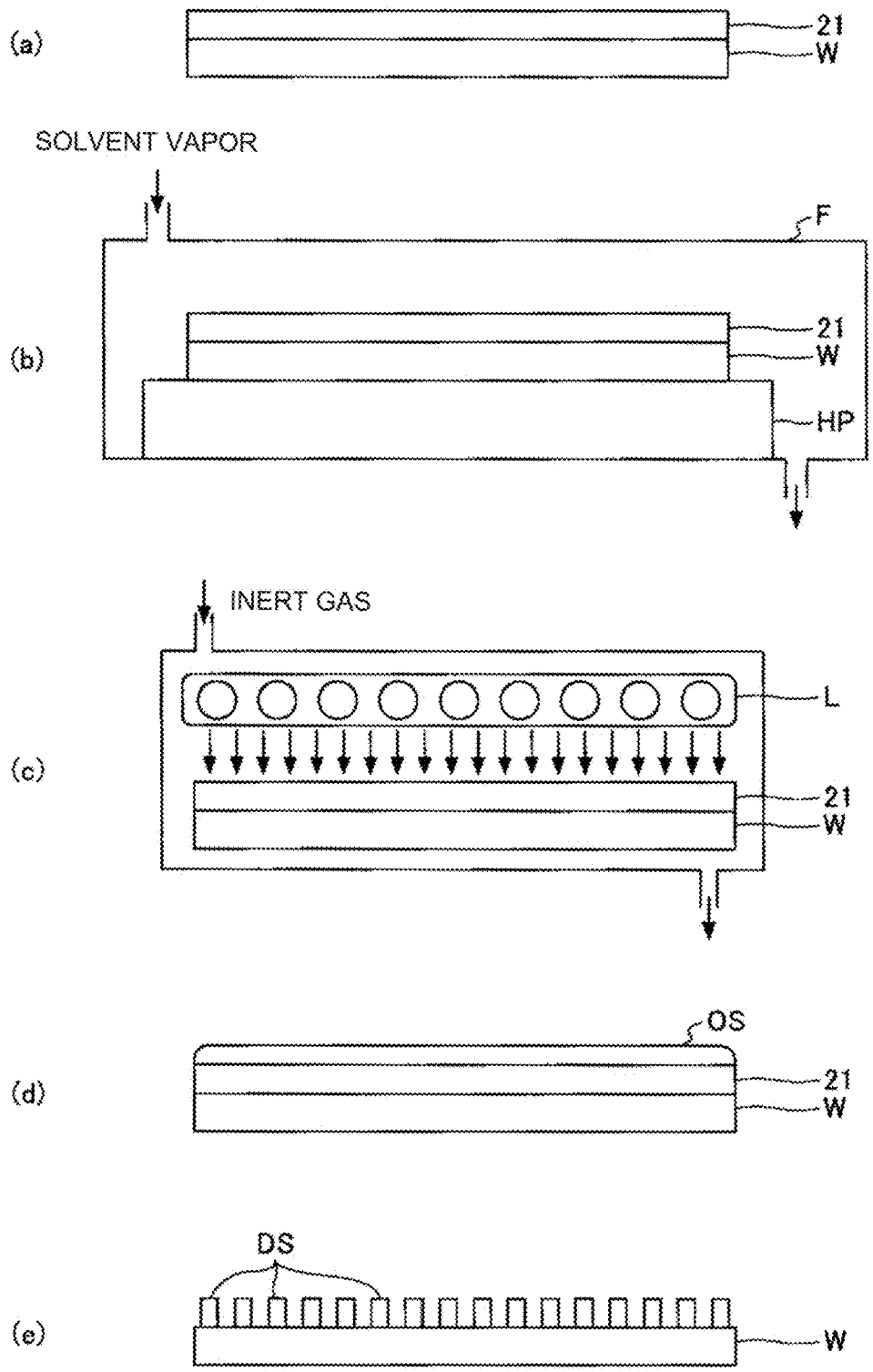
FIGS. 1 (a) to (e) are explanatory views for explaining respective steps of a pattern forming method according to an embodiment of the present invention.

Hereinafter, a not-limiting illustrative embodiment of the present invention will be described referring to the accompanying drawings. The same or corresponding reference numerals are given to the same or corresponding components or members in all accompanying drawings to omit repeated description.

FIG. 1 illustrates partial cross sections at respective steps of a substrate (for example, a semiconductor wafer) to be treated by a pattern forming method according to the embodiment of the present invention.

First, when a solution (hereinafter, also referred to as a coating solution) made by dissolving polystyrene (PS)-poly (methyl methacrylate) (PMMA) block copolymer (hereinafter, PS-b-PMMA) in an organic dissolving agent is applied onto the semiconductor wafer (hereinafter, simply the wafer) W as a substrate, for example, by the spin coating method, a film 21 of PS-b-PMMA is formed as illustrated in FIG. 1(a). A PS polymer and a PMMA polymer randomly mix together in the film 21.

Then, the wafer W on which the film 21 of PS-b-PMMA has been formed is transferred into a heating apparatus F and mounted on a hot plate HP as illustrated in FIG. 1(b). When the wafer W is heated, for example, by the hot plate HP at a predetermined temperature under a solvent vapor atmosphere, phase separation occurs in PS-b-PMMA in the film 21 on the wafer W. By the phase separation, PS polymer regions DS and PMMA polymer regions DM are alternately arrayed. Note that it is preferable to form a guider pattern on the surface of the wafer W in order to array the PS polymer regions DS and the PMMA polymer regions DM of PS-b-PMMA in a predetermined pattern.

Here, the solvent is not particularly limited as long as the PS polymer and the PMMA polymer can dissolve therein, and usable examples of the solvent include toluene, acetone, ethanol, methanol, and cyclohexanone. Further, the solvent is atomized using an atomizer and the atomized solvent can be transported by an inert gas into the heating apparatus F to generate the solvent vapor atmosphere inside the heating apparatus F. Further, the temperature of the film 21 during heating is preferably higher than the glass transition temperature of PS-b-PMMA and may be a temperature in a range, for example, from about 150° C. to 350° C.

After a lapse of a predetermined time, the supply of the solvent vapor into the heating apparatus F is stopped, and heating is further performed on the film 21 of PS-b-PMMA under an atmosphere of an inert gas (a rare gas such as a nitrogen gas, an argon gas or a helium gas) to dry the film 21. Thus, the solvent (and dissolving agent) in the film 21 evaporates. Note that the temperature of the film 21 during drying is preferably lower than the glass transition temperature to prevent the PS polymer and the PMMA polymer from flowing during drying.

After finish of the heating, the film 21 of PS-b-PMMA on the wafer W is irradiated with ultraviolet light, for example, under an atmosphere of a rare gas such as argon (Ar) or helium (He) or an inert gas such as a nitrogen gas as schematically illustrated in FIG. 1(c). The ultraviolet light is not particularly limited as long as it has a wavelength component belonging to an ultraviolet light region, but preferably has a wavelength component of for example, 200 nm or less. Further, the ultraviolet light further preferably contains a wavelength component of 185 nm or less that can be absorbed by PMMA. In the case of using the ultraviolet light having a wavelength component with a wavelength of 200 nm or less, an Xe excimer lamp emitting ultraviolet light with a wavelength of 172 nm can be preferably used as a light source L.

It is considered that when the film 21 of PS-b-PMMA is irradiated with the ultraviolet light, PS becomes difficult to dissolve in the organic solvent because crosslinking reaction occurs in PS, whereas PMMA becomes easy to dissolve in the organic solvent because the main chain is cut in PMMA. Note that in the case of using the ultraviolet light with a wavelength of 172 nm, its irradiation intensity (dose amount) is preferably about 180 mJ or less. Irradiation of the film 21 of PS-h-PMMA with the ultraviolet light with a wavelength of 172 nm at a dose amount of greater than 180 mJ makes the organic solvent easy to permeate the PS polymer regions DS when the organic solvent is supplied to the film 21 of PS-b-PMMA afterwards, with the result that the PS polymer regions DS swell and the PMMA polymer regions DM become difficult to remove. Further, in the case where the dose amount of the ultraviolet light is greater than 180 mJ, the PMMA polymer regions DM may change in quality and solidify and thus may become difficult to dissolve in the organic solvent.

Note that an oxygen concentration in the atmosphere around the wafer W is decreased by the inert gas and, concretely, an oxygen concentration in the inert gas atmosphere of 400 ppm or less is sufficient.

Next, as illustrated in FIG. 1(d), an organic solvent OS is supplied to the film 21 of PS-b-PMMA. Due to the organic solvent OS, the PMMA polymer regions DM in the film 21 dissolve and the PS polymer regions DS remain on the surface of the wafer W. Here, as the organic solvent OS, for example, isopropyl alcohol (IPA) can be preferably used.

When the surface of the wafer W is dried after a lapse of a predetermined time, a pattern composed of the PS polymer regions DS is obtained on the surface of the wafer W as illustrated in FIG. 1(e).

In the pattern forming method according to the above-described embodiment, the heating of the film 21 of PS-b-PMMA is performed under the solvent vapor atmosphere, so that the solvent can be absorbed into the film 21 during heating. Therefore, even if the dissolving agent remaining in the film 21 evaporates, it is possible to inhibit, b the absorbed solvent, a decrease in concentration of the PS polymer and the PMMA polymer in the film 21 (with respect to the dissolving agent and the solvent). Accordingly, the fluidity of the PS polymer and the PMMA polymer can be maintained to facilitate the phase separation. Thus, accelerating the fluidization of PS-b-PMMA enables acceleration of the phase separation.

Further, when the film 21 is heated, for example, under an air atmosphere, the dissolving agent remaining in the film 21 evaporates, so that the fluidity of the PS polymer and the PMMA polymer may be lost. Therefore, there is no choice but to set the heating temperature to, for example, about 150° C., or lower. At such a low temperature, the phase separation takes a long time to result in a decrease in throughput. In contrast, according to the pattern forming method of this embodiment, since the film 21 is heated under the solvent vapor atmosphere, the heating temperature can be increased. This makes it possible to further accelerate the phase separation.

Figure 2:
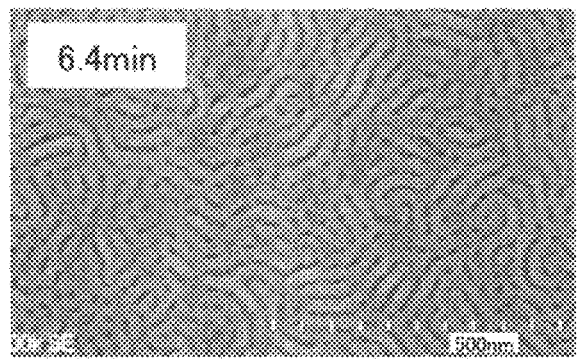
FIGS. 2 (a) to (c) are surface images of patterns formed by the pattern forming method according to the embodiment of the present invention.
Figure 2:
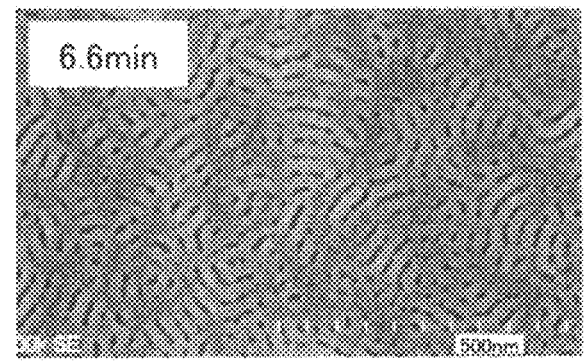
Figure 2:
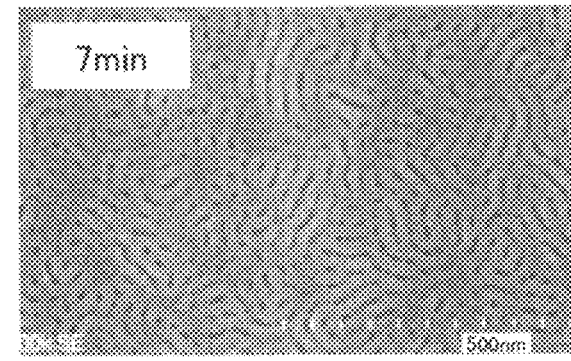

Next, a result of forming patterns of the PS polymer regions DS formed following the above-described pattern forming method will be described referring to FIG. 2.

FIG. 2(a) and FIG. 2(b) are scanning electron microscope (SEM) images obtained by photographing upper surfaces of the patterns formed using PS-b-PMMA. More specifically, the upper surfaces of the patterns formed of the PS polymer regions DS illustrated in FIG. 1(e). Note that since no guide pattern was used at the time when these patterns were formed, they are patterns in a shape of fingerprints.

Further, as for the pattern illustrated in FIG. 2(a), an atmosphere around the wafer W when heating the film 21 of PS-b-PMMA (FIG. 1(b)) was a toluene vapor atmosphere. A toluene partial pressure in this event was set to about 15 Torr (normal pressure due to toluene at this partial pressure and nitrogen gas). Further, also for the pattern illustrated in FIG. 2(b), the atmosphere around the wafer W when heating the film 21 of PS-b-PMMA was the toluene vapor atmosphere. A toluene partial pressure in this event was set to about 30 Torr. Further, FIG. 2(c) illustrates the pattern (the PS polymer regions DS) formed by heating the wafer W in air at an atmospheric pressure for comparison. Comparing their SEM images, it is found that a clearer pattern can be obtained in a short time in the case of heating the wafer W (and the film 21) under the atmosphere of toluene vapor. This is probably because the fluidity of the PS polymer and the PMMA polymer in the film 21 of PS-b-PMMA is improved, by the toluene vapor as compared with that in the case of only air.

Figure 3:
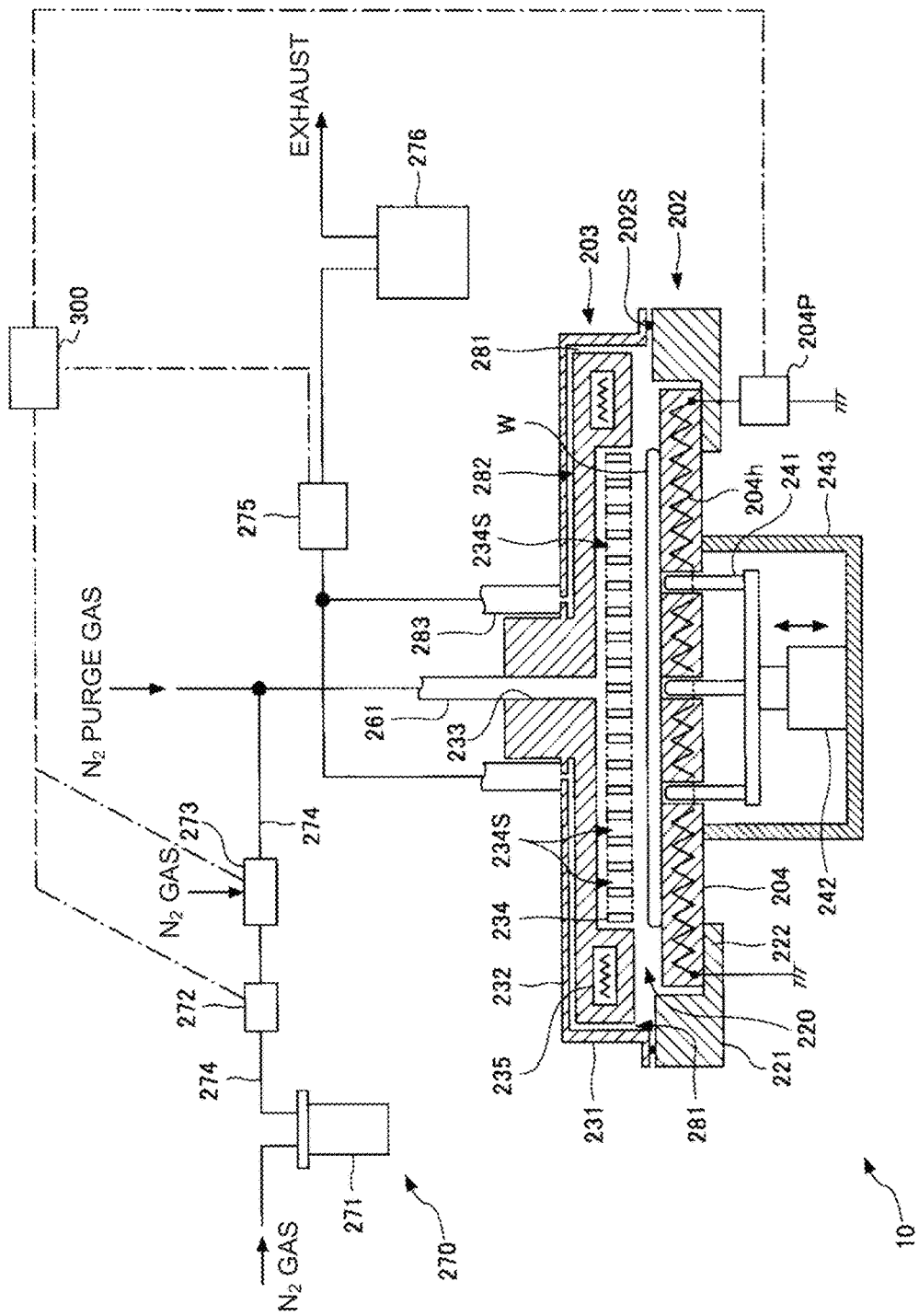
FIG. 3 A schematic configuration view of a heating apparatus according to the embodiment of the present invention.

Next, a heating apparatus according to the embodiment of the present invention preferable to carry out the pattern forming method according to the embodiment of the present invention will be described. FIG. 3 is a schematic configuration view of the heating apparatus.

Referring to FIG. 3, a heating apparatus 10 includes a container body 202 in a cylindrical shape having an upper end opening and a bottom portion, and a lid body 203 covering the upper end opening of the container body 202. The container body 202 includes a frame body 221 having a circular ring shape, a bottom part 222 in a flange shape extending inward from a bottom portion of the frame body 221, and a wafer mounting table 204 supported by the bottom part 222. Inside the wafer mounting table 204, a heating unit 204h is provided, and a power supply 204P is connected to the heating unit 204h. This heats the wafer W mounted on the wafer mounting table 204. The heating unit 204h, the power supply 204P, and a temperature regulator (not illustrated) heat the wafer mounting table 204 to thereby heat the wafer W mounted on the wafer mounting table 204.

The wafer mounting table 204 is provided with a plurality of raising and lowering pins 241 for delivering the wafer W to/from an external transfer means (not illustrated), and the raising and lowering pins 241 are configured to freely rise and lower by means of a raising and lowering mechanism 242. A reference numeral 243 in the drawing denotes a cover body that is provided on the rear surface of the wafer mounting table 204 and surrounds the periphery of the raising and lowering mechanism 242. The contain body 202 and the lid body 203 are configured to freely relatively rise and lower with respect to each other. In this example, the lid body 203 freely rises and lowers by means of the raising and lowering mechanism (not illustrated) between a treatment position where it is connected to the container body 202 and a substrate transfer-in/out position located above the container body 202.

On the other hand, as for the lid body 203, an edge part 231 of the lid body 203 is mounted on the upper surface of the frame body 221 of the container body 202 via a sealing member 202S such as an O-ring. Thus, the upper end opening of the container body 202 is closed with the lid body 203. Further, a treatment chamber 220 is demarcated between the container body 202 and the lid body 203.

A gas supply path 233 for supplying gas containing solvent vapor (hereinafter, referred to simply as solvent vapor) to the wafer W mounted on the wafer mounting table 204 penetrates a central portion of the lid body 203. To the gas supply path 233, a pipe 261 is connected which is connected to a later-described solvent vapor supply mechanism 270. Further, a nitrogen gas supply source (not illustrated) that purges the treatment chamber 220 is connected to the pipe 261, and can supply a nitrogen gas as a purge gas to the treatment chamber 220.

A current regulating plate 234 is disposed below a lower end portion of the gas supply path 233. The current regulating plate 234 is formed with a plurality of slits (or openings) 234S. The plurality of slits 234S are configured to allow the solvent vapor flowing out of the gas supply path 233 to flow toward the wafer mounting table 204, and generate a large pressure difference between a space on an upper side (gas supply path 233 side) of the current regulating plate 234 and a space on a lower side (wafer mounting table 204 side). Therefore, the solvent vapor supplied to the treatment chamber 220 through the gas supply path 233 spreads in the lateral direction, namely, toward the outer periphery of the lid body 203 on the upper side of the current regulating plate 234 and flows toward the wafer W through the slits 234S. Accordingly, the solvent vapor can be supplied to the wafer W at an almost uniform concentration.

Further, inside an upper wall part 232 of the lid body 203, a flat hollow part 282 is formed which extends in a planar manner in a region other than a central region where the gas supply path 233 is formed and has a planar shape, for example, in a ring shape. To the hollow part 282, an exhaust path 281 is coupled which extends in the longitudinal direction on the outer peripheral side of the lid body 203 and outside the wafer W on the wafer mounting table 204 and opens into the treatment chamber 220. To the hollow part 282, a plurality of (for example, six) exhaust pipes 283 are further connected, for example, at a region near the center of the lid body 203. The exhaust pipes 283 are connected to an ejector 275, and the ejector 275 is connected to a trap tank 276. Note that a reference numeral 235 in FIG. 3 denotes a heater, and the heater 235 heats the lid body 203 to a predetermined temperature. This inhibits condensation of the solvent vapor to the lid body 203.

The solvent vapor supply mechanism 270 has a solvent tank 271, a flow rate controller 272, and a vaporizer 273. A solvent is stored inside the solvent tank 271, and the solvent flows out to a pipe 274 by pressurization of the inside with the nitrogen gas from the nitrogen gas supply source (not illustrated), and is controlled in flow rate by the flow rate controller 272 and then supplied to the vaporizer 273. In the vaporizer 273, the solvent is atomized and supplied to the pipe 261 through the pipe 274 together with the nitrogen gas supplied from the nitrogen gas supply source.

Further, in the heating apparatus 10, as illustrated in FIG. 3, a control unit 300 electrically connected, as schematically illustrated with a one-dotted chain line in the drawing, to parts or members constituting the heating apparatus 10, such as the power supply 204P, the solvent vapor supply mechanism 270, and the ejector 275. The control unit 300 is composed of, for example, a computer and has a not-illustrated program storage unit. In the program storage unit, a program is stored in which commands are combined to cause the heating apparatus 10 to perform a heating step (see FIG. 1(b)) of heating, under the solvent vapor atmosphere, the wafer on which the film of the block copolymer has been formed. The control unit 300 outputs based on the program command signals to the parts or members such as the power supply 204P, the solvent vapor supply mechanism 270, and the ejector 275 to control the power to be supplied from the power supply 204P to the heating unit 204h, the flow rate and concentration of the solvent vapor to be supplied by the flow rate controller 272 and the vaporizer 273 of the solvent vapor supply mechanism 270, and the ejection rate of gas containing the solvent vapor ejected from the treatment chamber 220 by the ejector 274. The program is stored in the program storage unit in a state of being stored in a storage medium such as a hard disk, a compact disk, a magneto-optical disk, or a memory card.

With the above configuration, the solvent vapor generated by the solvent vapor supply mechanism 270 is supplied to the treatment chamber 220 through the pipe 261 and the gas supply path 233, and supplied more uniformly by the current regulating plate 234 to the wafer W heated by the heating unit 204h. Then, the solvent vapor is ejected by the ejector 275 after passing through the exhaust path 281, the hollow part 282, and the exhaust pipe 283. The gas ejected by the ejector 275 reaches the trap tank 276, in which a solvent component in the gas is removed, and ejected to the outside. Note that the pressure in the treatment chamber 220 can be controlled by the supply rate of the solvent vapor to be supplied thereto and the ejector 275, and is preferably maintained at a normal pressure or a pressure (weak positive pressure) of 0 Pa to 30 kPa with respect to the normal pressure.

According to the heating apparatus 10 having the above configuration, the wafer W can be heated under the solvent vapor atmosphere. Accordingly, accelerating the fluidization of the polymers of the block copolymer enables acceleration of the phase separation.

The present invention has been described referring to the preferred embodiment of the present invention, but the present invention is not limited to the above-described embodiment and can be variously changed and modified within the scope of the spirit of the present invention as set forth in claims.

For example, when heating the film of the block copolymer under the solvent vapor atmosphere, the concentration of the solvent vapor (containing the vapor of a mixed solvent mentioned below) in the atmosphere around the wafer W may be gradually decreased. Further, the solvent vapor atmosphere may be formed by a mixed solvent made by mixing at least two of toluene, acetone, ethanol, methanol, and cyclohexanone. Further, toluene having a high solubility to the PS-b-PMMA block copolymer may be used during heating, and then acetone having a low solubility may be used. This makes it possible to increase the fluidity of the PS polymer and the PMMA polymer at an initial stage to early subject them to phase separation, and decrease the fluidity after the PS polymers and the PMMA polymers gather together to some extent, thereby making it easier to array them into a predetermined pattern. Note that the same effect can be achieved also by decreasing the temperature during heating. For example, the temperature during heating may be decreased stepwise or gradually from about 300° C. to about 100° C.

Further, a heating period may be divided into first to third periods according to the kind of the solvent. For example, the film of the block copolymer may be heated under a vapor atmosphere of only toluene in the first period, the film of the block copolymer may be heated under a vapor atmosphere of a mixed solvent of toluene and acetone in the second period, and the film of the block copolymer may be heated under a vapor atmosphere of only acetone in the third period. Furthermore, the concentration of toluene in the mixed solvent of toluene and acetone may be set to 50% (the concentration of acetone may also be set to 50%) in the second period. Further, the concentration of toluene may be changed from 100% to 0% and the concentration of acetone may be changed from 0% to 100% in the second period.

Note that in the case of using two or more kinds of solvents, a plurality of solvent vapor supply mechanisms 270 corresponding to the solvents may be provided, instead of storing a mixed solvent made by mixing them in the solvent tank 271. In this case, the plurality of solvent vapor supply mechanisms 270 can be controlled by the control unit 300. Thus, the control unit 300 controls the solvent vapor supply mechanisms 270 and thereby makes it possible to easily perform change of the solvent to be used and change of the solvent concentration.

Further, though the atmosphere around the wafer W is the mixed gas atmosphere of the toluene vapor and the nitrogen gas in the above-described embodiment, a rare gas such as an argon gas or a helium gas, or clean air may be used in place of the nitrogen gas.

Further, examples of the block copolymer include, but not limited to PS-b-PMMA which has been exemplified in the above embodiment, polybutadiene-polydimethylsiloxane, polybutadiene-4-vinylpyridine, polybutadiene-methylmethacrylate, polybutadiene-poly-t-butylmethacrylate, polybutadiene-t-butylacrylate, poly-t-butylmethacrylate-poly-4-vinylpyridine, polyethylene-polymethylmethacrylate, poly-t-butylmethacrylate-poly-2-vinylpyridine, polyethylene-poly-2-vinylpyridine, polyethylene-poly-4-vinylpyridine, polyisoprene-poly-2-vinylpyridine, polymethylmethacrylate-polystyrene, poly-t-butylmethacrylate-polystyrene, polymethylacrylate-polystyrene, polybutadiene-polystyrene, polyisoprene-polystyrene, polystyrene-poly-2-vinylpyridine, polystyrene-poly-4-vinylpyridine, polystyrene-polydimethylsiloxane, polystyrene-poly-N,N-dimethylacrylamide, polybutadiene-sodium polyacrylate, polybutadiene-polyethyleneoxide, poly-t-butylmethacrylate-polyethyleneoxide, polystyrene-polyacrylic acid, polystyrene-polymethacrylic acid and so on.

In particular, the fluidity of the block copolymer composed of an organic polymer and an inorganic polymer like polystyrene-polydimethylsiloxane (PS-b-PDMS) is low, so that the embodiment of the present invention is preferably applicable to the case of using such a block copolymer.

Note that the above-described solvent vapor supply mechanism 270 may have a bubbler tank that generates the solvent vapor by bubbling the solvent stored therein with a carrier gas and a controller that controls the flow rate of the carrier gas containing the solvent vapor in place of the solvent tank 271, the flow rate controller 272, and the vaporizer 273.

Further, the temperature of heating the wafer W the heating time and so on are exemplified in the above-described pattern forming method, but the heating temperature, the heating time and so on are not limited to this and may be set through a preparatory experiment or the like as a matter of course.

EXPLANATION OF CODES 10 heating apparatus
204 wafer mounting table
204h heating unit
234 current regulating plate
261 pipe
233 gas supply path
220 treatment chamber
234 current regulating plate
281 exhaust path
282 hollow part
283 exhaust pipe
270 solvent vapor supply mechanism
271 solvent tank
272 flow rate controller
273 vaporizer
275 ejector
276 trap tank
W wafer

What is claimed:
1. A heating apparatus for heating a substrate, comprising:
a mounting table which is disposed in a container and on which the substrate, on which a film of a block copolymer is to be formed, is mounted;
a heating unit which is embedded in the mounting table and heats the substrate mounted on the mounting table;
a solvent vapor supply unit which supplies gas containing vapor of a solvent into the container;
an ejection unit which ejects the gas in the container; and
a control unit configured to
control the solvent vapor supply unit, the ejection unit, and the heating unit to heat the film of the block copolymer containing at least two polymers in the container under a solvent vapor atmosphere to subject the block copolymer to phase separation,
  wherein, in the phase separation, a partial pressure of a solvent vapor in the solvent vapor atmosphere is decreased continuously or stepwise,
  wherein, in the phase separation, early phase separation is obtained by control that increases fluidity of the polymers during an initial stage, and decreases the fluidity after the polymers gather together to array the polymers in a predetermined pattern.

2. The heating apparatus according to claim 1,
  wherein the control unit is further configured to control solvent vapor supply unit to decrease continuously or stepwise the partial pressure of the vapor of the solvent in gas containing the vapor of the solvent.

3. The heating apparatus according to claim 1,
  wherein the vapor of the solvent contains vapor of a first solvent and vapor of a second solvent.

4. The heating apparatus according to claim 1,
  wherein the solvent vapor supply unit supplies gas containing vapor of a first solvent into the container, and
  wherein the heating apparatus further comprises:
  an additional solvent vapor supply unit which supplies gas containing vapor of a second solvent into the container; and
  wherein the control unit is further configured to control the solvent vapor supply unit and the additional solvent vapor supply unit to change with time a ratio between a partial pressure of the vapor of the first solvent and a partial pressure of the vapor of the second solvent.

5. The heating apparatus according to claim 4,
  wherein the control unit is further configured to control the solvent vapor supply unit and the additional solvent vapor supply unit to change the vapor of the solvent in the gas containing the vapor of the solvent to be supplied into the container, from the vapor of the first solvent to the vapor of the second solvent.

6. The heating apparatus according to claim 1,
  wherein the control unit is further configured to control the heating unit to decrease a temperature of heating the film of the block copolymer.

7. The heating apparatus according to claim 1,
  wherein the heating unit heats the film of the block copolymer on the substrate under an inert gas atmosphere.

8. The heating apparatus according to claim 7,
  wherein a temperature when drying the film of the block copolymer is higher than a temperature when heating the film of the block copolymer.

9. The heating apparatus according to claim 1,
  wherein the control unit is further configured to control the solvent vapor supply unit to supply the gas to remove one of the polymers in the film of the phase-separated block copolymer.

* * * * *